(12) United States Patent
Kim et al.

(10) Patent No.: US 11,764,291 B2
(45) Date of Patent: Sep. 19, 2023

(54) METHOD OF DIFFUSING NITROGEN INTO A TUNNEL LAYER OF A NONVOLATILE MEMORY

(71) Applicant: SK hynix Inc., Icheon-si (KR)

(72) Inventors: Bo Yun Kim, Seongnam-si (KR); Se Ho Lee, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/878,893

(22) Filed: Aug. 1, 2022

(65) Prior Publication Data

US 2022/0376092 A1 Nov. 24, 2022

Related U.S. Application Data

(62) Division of application No. 16/701,931, filed on Dec. 3, 2019, now Pat. No. 11,437,499.

(30) Foreign Application Priority Data

Dec. 27, 2018 (KR) ........................ 10-2018-0171069

(51) Int. Cl.
*H01L 29/66* (2006.01)
*H01L 21/02* (2006.01)
*H01L 29/792* (2006.01)
*H10B 43/27* (2023.01)

(52) U.S. Cl.
CPC .. *H01L 29/66833* (2013.01); *H01L 21/02332* (2013.01); *H01L 29/792* (2013.01); *H10B 43/27* (2023.02)

(58) Field of Classification Search
CPC combination set(s) only.
See application file for complete search history.

(56) References Cited

U.S. PATENT DOCUMENTS

| 8,716,155 | B2 | 5/2014 | Ramappa et al. | |
|---|---|---|---|---|
| 2002/0019097 | A1* | 2/2002 | Arai | H01L 27/115 438/257 |
| 2006/0202261 | A1* | 9/2006 | Lue | H01L 27/115 257/E21.679 |
| 2007/0138539 | A1 | 6/2007 | Wu | |
| 2008/0067577 | A1 | 5/2008 | Wang | |
| 2008/0099830 | A1 | 5/2008 | Lue | |
| 2010/0117139 | A1 | 5/2010 | Lue | |
| 2011/0147827 | A1 | 6/2011 | Simsek-Ege | |
| 2013/0005155 | A1* | 1/2013 | Ramappa | H01L 29/4234 257/E21.267 |
| 2015/0279955 | A1 | 10/2015 | Choi et al. | |
| 2016/0126248 | A1 | 5/2016 | Rabkin | |

FOREIGN PATENT DOCUMENTS

| KR | 100975941 B1 | 8/2009 |
|---|---|---|
| KR | 20160009299 A | 1/2016 |
| KR | 20160017840 A | 2/2016 |

* cited by examiner

*Primary Examiner* — Peter Bradford

(57) ABSTRACT

In a method of fabricating a nonvolatile memory device according an embodiment, a first tunnel oxide layer, a nitrogen supply layer, and a second tunnel oxide layer having a density lower than that of the first tunnel oxide layer are formed on a substrate. Nitrogen in the nitrogen supply layer is diffused into the second tunnel oxide layer to convert at least a portion of the second tunnel oxide layer into an oxynitride layer.

10 Claims, 17 Drawing Sheets

METHOD OF DIFFUSING NITROGEN INTO A TUNNEL LAYER OF A NONVOLATILE MEMORY

CROSS-REFERENCE TO RELATED APPLICATION

The present application is a divisional application of a U.S. patent application Ser. No. 16/701,931, filed on Dec. 3, 2019, which claims priority under 35 U.S.0 119(a) to Korean Patent Application No. 10-2018-0171069, filed on Dec. 27, 2018, which is herein incorporated by reference in its entirety.

BACKGROUND

1. Technical Field

Various embodiments of the present disclosure generally relate to a semiconductor device and, more particularly, to a nonvolatile memory device and a method of fabricating the same.

2. Related Art

As design rules decrease and degree of integration increases, research on structures of memory devices that can guarantee both structural stability and reliability of storage operation has continued. Recently, a transistor-type nonvolatile memory device has been proposed in which a three-layered structure of a charge tunneling layer, a charge trap layer and a charge barrier layer is applied. The nonvolatile memory device can store signal information through the entry and storage of charge into the charge trap layer through a program and an erase operation. The nonvolatile memory device can be implemented as a device of a NAND type structure in which pluralities of cell transistors are connected to each other to make a string form.

SUMMARY

There is disclosed a method of fabricating a nonvolatile memory device according to an aspect of the present disclosure. In the method, a first tunnel oxide layer, a nitrogen supply layer and a second tunnel oxide layer having a density lower than that of the first tunnel oxide layer are sequentially formed on a substrate. Nitrogen in the nitrogen supply layer is diffused into the second tunnel oxide layer to convert at least a portion of the second tunnel oxide layer into an oxynitride layer.

There is disclosed a method of fabricating a nonvolatile memory device according to another aspect of the present disclosure. In the method, a substrate is provided. A cell electrode structure including interlayer insulating layers and gate electrode layers that are alternately staked is formed on the substrate. A trench penetrating the cell electrode structure on the substrate is formed. A charge trap layer is formed on a sidewall surface of the trench. A first sidewall oxide layer having a first density, a nitrogen supply layer, and a second sidewall oxide layer having a second density higher than the first density are sequentially formed on the charge trap layer. Nitrogen in the nitrogen supply layer is diffused into the first sidewall oxide layer to convert at least a portion of the first sidewall oxide layer into an oxynitride layer.

There is disclosed a nonvolatile memory device according to yet another aspect of the present disclosure. The nonvolatile memory device includes a channel layer, a first tunneling layer disposed on the channel layer and including a first oxide material, a second tunneling layer disposed on the first tunneling layer and including an oxynitride material, a third tunneling layer disposed on the second tunneling layer and including a second oxide material having a different density as compared to the first oxide material, and a charge trap layer disposed on the third tunneling layer. A bandgap energy of the second tunneling layer is lower than bandgap energies of the first and third tunnel layers.

DETAILED DESCRIPTION

Figure 1:
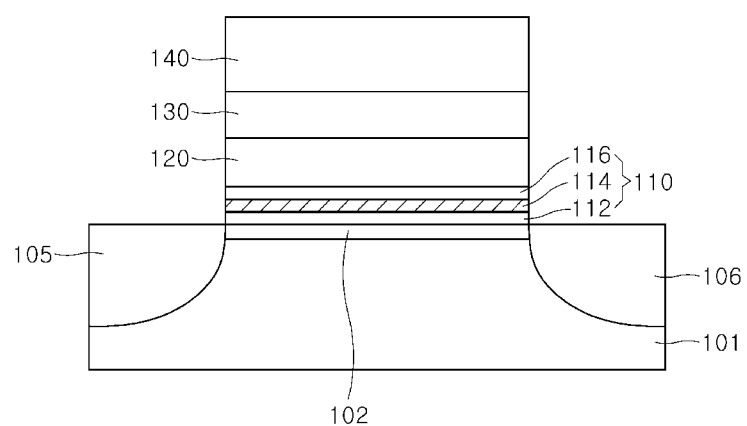
FIG. 1 schematically illustrates a nonvolatile memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

FIG. 1 is a plan view schematically illustrating a nonvolatile memory device according to an embodiment of the present disclosure. Referring to FIG. 1, the nonvolatile memory device 1 may include a substrate 101, a charge tunneling structure 110, a charge trap layer 120, a charge barrier layer 130 and a gate electrode layer 140. In addition, the substrate 101 may include a channel layer 102 located below the charge tunneling structure 110, and a source region 105 and a drain region 106 that are respectively located in the substrate 101 opposite to each other with respect to the channel layer 102. In an embodiment, the nonvolatile memory device 1 may be a flash memory device in the form of a field effect transistor.

The substrate 101 may, for example, include a semiconductor material. The substrate 101 may, for example, be a silicon (Si) substrate, a gallium arsenic (GaAs) substrate, an indium phosphide (InP) substrate, a germanium (Ge) substrate, or a silicon germanium (SiGe) substrate. In an embodiment, the substrate 101 may be doped to have conductivity. As an example, the substrate 101 may be doped with an n-type dopant or a p-type dopant. As another example, the substrate 101 may include a well region doped with an n-type dopant or a p-type dopant therein.

The source region 105 and the drain region 106 may be regions of the substrate 101, which are doped into n-type or p-type. When the substrate 101 is doped into n-type or p-type, the source region 105 and the drain region 106 may be regions doped with a dopant of the opposite type to the doping type of the substrate 101. The channel layer 102 is a region where a carrier having a charge is conducted when a voltage is applied between the source region 105 and the drain region 106. As an example, the channel layer 102 may mean a region of the substrate 101, where the mobility of electrons or holes is high between the source region 105 and the drain region 106.

The charge tunneling structure 110 may be disposed on the substrate 101. The charge tunneling structure 110 may include a first tunneling layer 112, a second tunneling layer 114 and a third tunneling layer 116 that are sequentially disposed on the channel layer 102. In an embodiment, the first tunneling layer 112 may include a first oxide material. The second tunneling layer 114 may include a predetermined oxynitride material. The third tunneling layer 116 may include a second oxide material having a different density from the first oxide material. In a specific embodiment, the density of the first oxide material is higher than the density of the second oxide material. Accordingly, a concentration of defects present in the first oxide material may be lower than a concentration of defects present in the second oxide material. The defects in the first and second oxide materials serve as trap sites for charge, thereby causing leakage current to occur in the first and second oxide materials. As a result, the first oxide material may have a relatively excellent insulation characteristic as compared with the second oxide material.

The first and second oxide materials may have first and second nitrogen diffusion rates, respectively. Since the density of the first oxide material is higher than the density of the second oxide material, the first nitrogen diffusion rate in the first tunneling layer is lower than the second nitrogen diffusion rate in the third tunneling layer. In other words, in a fabricating process described below, when nitrogen is diffused into the first and third tunneling layers, nitrogen diffusion within the third tunneling layer may be predominate over nitrogen diffusion within the first tunneling layer. In a specific embodiment, in the fabricating process, nitrogen diffusion into the first tunneling layer may be suppressed and nitrogen diffusion into the third tunneling layer can occur.

Figure 2A:
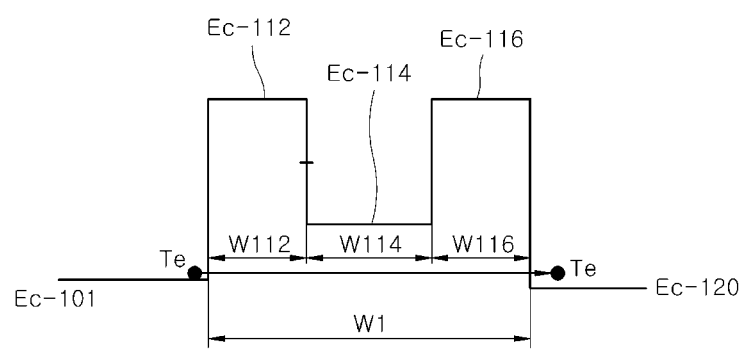
FIGS. 2A and 2B are views schematically explaining an operation of a charge tunneling structure of a nonvolatile memory device according to an embodiment of the present disclosure.
Figure 2B:
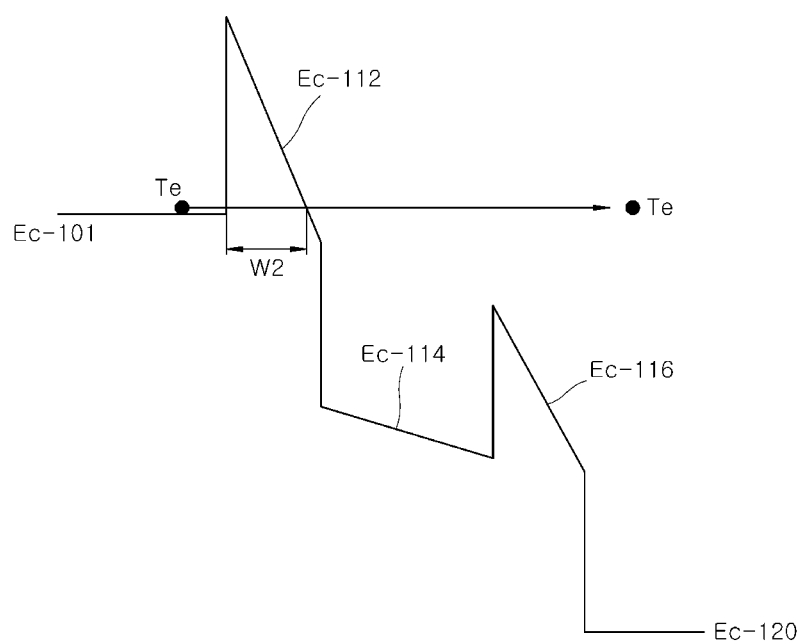

The second tunneling layer 114 may have a relatively low band gap energy compared to the first and third tunneling layers 112 and 116. In an embodiment, the second tunneling layer 114 may have a higher dielectric constant than the first and third tunneling layers 112 and 116. As illustrated in FIGS. 2A and 2B, the second tunneling layer 114 functions as a barrier against tunneling of charges passing through the tunneling structure 110 at an electric field lower than a predetermined threshold electric field. On the other hand, the second tunneling layer 114 does not function as a barrier against tunneling of charges at an electric field exceeding the predetermined threshold electric field, thereby improving charge tunneling efficiency.

In an embodiment, the first oxide material may include silicon oxide, the oxynitride material may include silicon oxynitride, and the second oxide material may include silicon oxide having a density lower than that of the silicon oxide of the first oxide material. That is, the second oxide material may have a relatively lower bonding frequency of silicon and oxygen than the first oxide material.

Referring to FIG. 1 again, the charge trap layer 120 and the charge barrier layer 130 may be sequentially disposed on the charge tunneling structure 110. The charge trap layer 120 may trap electrons introduced from the channel layer 102 in the trap sites of the charge trap layer 120, thereby storing the electrons non-volatilely, during program operation. In addition, the charge trap layer 120 may recombine holes introduced from the channel layer 102 with the electrons stored in the charge trap layer 120, thereby erasing the stored electrons. The charge trap layer 120 may have a band gap energy lower than those of the charge barrier layer 130 and the third tunneling layer 116. In an embodiment, the charge trap layer 120 may include a nitride material or an oxynitride material. As an example, the charge trap layer 120 may be a silicon nitride layer or a silicon oxynitride layer.

The charge barrier layer 130 may function to suppress electrons or holes introduced from the channel layer 102 into the charge trap layer 120 to move to the gate electrode layer 140. The charge barrier layer 130 may include an oxide material. As an example, the charge barrier layer 130 may be a silicon oxide layer.

The gate electrode layer 140 may include a conductive material. The conductive material may, for example, include tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

According to the embodiment of the present disclosure, the nonvolatile memory device 1 may have the sequentially stacked first to third tunneling layers 112, 114 and 116 as a charge tunneling structure. The first to third tunneling layers 112, 114 and 116 may be arranged such that the band gap energy of the second tunneling layer 114 is smaller than those of the first and third tunneling layers 112 and 116. Accordingly, as in FIGS. 2A and 2B described below, the tunneling efficiency of electrons and holes between the channel layer 102 and the charge trap layer 120 can be increased, so that the programming and erasing performance of the nonvolatile memory device can be improved.

FIGS. 2A and 2B are views schematically explaining an operation of a charge tunnel structure of a nonvolatile memory device according to an embodiment of the present disclosure. The nonvolatile memory device of FIGS. 2A and 2B have a substantially the same configuration as the nonvolatile memory device 1 described above with reference to FIG. 1. FIG. 2A is a view representing a state in which no voltage is applied between a substrate 101 and a gate electrode layer 140 of the nonvolatile memory device 1, and FIG. 2B is a view representing a state in which a program voltage is applied between the substrate 101 and the gate electrode layer 140 of the nonvolatile memory device 1. FIGS. 2A and 2B illustrate conduction band energies Ec-101, Ec-112, Ec-114, Ec-116 and Ec-120 of the substrate 101, the first tunneling layer 112, the second tunneling layer 114, the third tunneling layer 116 and the charge trap layer 120, respectively.

Referring to FIG. 2A, an energy band structure is illustrated in a state in which the substrate 101 is connected to a ground line and a bias is not applied to the gate electrode layer 140. When the electrons Te located in the conduction band of the channel layer 102 in the substrate 101 travel through the first to third tunneling layers 112, 114 and 116 and move to the charge trap layer 120, the electrons Te of the channel layer 102 should tunnel through the first tunneling width W1 which is the sum of the widths W112, W114 and W116 of the first to third tunneling layers 112, 114 and 116. That is, when a voltage is not applied between the substrate 101 and the gate electrode layer 140, the first to third tunneling layers 112, 114 and 116 may function as barrier layers for tunneling of the electrons Te located in the channel layer 102.

Referring to FIG. 2B, an energy band structure is illustrated in a state in which the substrate 101 is connected to the ground line and a predetermined positive bias is applied to the gate electrode layer 140, so that a voltage of a predetermined threshold voltage or higher is applied between the substrate 101 and the gate electrode layer 140. In this case, the electrons Te located in the conduction band of the channel layer 102 in the substrate 101 may move to the charge trap layer 120 according to the Fowler-Nordheim tunneling (FN tunneling) mechanism. As an example, as illustrated in FIG. 2B, since the band gap energy of the second tunneling layer 114 is smaller than the band gap energies of the first and third tunneling layers 112 and 116, the electrons Te of the channel layer 102 can move directly to the charge trap layer 120 by tunneling only the first tunneling layer 112 having a reduced tunneling width W2 from the predetermined width W112 of FIG. 2A.

As described above, in the embodiment of the present disclosure, when a gate voltage of a predetermined threshold voltage or higher is applied between the substrate 101 and the gate electrode layer 140, tunneling efficiency of electrons from the channel layer 102 in the substrate 101 to the charge trap layer 120 can be improved.

Although not illustrated, when a gate voltage less than a predetermined threshold voltage is applied between the substrate 101 and the gate electrode layer 140, at least one of the first to third tunneling layers 112, 114 and 116 functions as a barrier layer for the tunneling of the electrons Te, so that leakage current generated by the electrons Te can be blocked. In some other embodiments, the electrons located in the conduction band of the channel layer 102 in the substrate 101 can overcome the energy barrier between the substrate 101 and the first tunneling layer 112 and move to the second tunneling layer 114 through thermal activation but not through tunneling. In this case, since the band gap energy of the second tunneling layer 114 is smaller than the band gap energies of the first and third tunneling layers 112 and 116, the second tunneling layer 114 can form energy barriers at interfaces with the first and third tunneling layers 112 and 116, respectively. As a result, the leakage current can be blocked by further suppressing the movement of the electrons introduced into the second tunneling layer 114 to the substrate 101 or the charge trap layer 120.

Although FIGS. 2A and 2B illustrate an operation of the first to third tunneling layers 112, 114 and 116 according to the embodiment of the present disclosure using a program operation of the nonvolatile memory device 1, the first to third tunneling layers 112, 114 and 116 may have a substantially the same operation mode in an erase operation of the nonvolatile memory device 1. However, during the erase operation, the substrate 101 may be connected to the ground line and a predetermined negative bias may be applied to the gate electrode layer 140. At this time, when a voltage less than a predetermined threshold voltage is applied between the substrate 101 and the gate electrode layer 140, at least one of the first to third tunneling layers 112, 114 and 116 can function as a tunneling barrier for holes. Conversely, when a voltage equal to or higher than a predetermined threshold voltage is applied between the substrate 101 and the gate electrode layer 140, if holes located in the conduction bad of the channel layer 102 in the substrate 101 pass only the first tunneling layer 112 having a reduced tunneling width from the predetermined width W112 in FIG. 2A, the holes can move directly to the charge trap layer 120 and recombine with electrons stored in the charge trap layer 120, thereby perform the erase operation. As a result, erasing efficiency of the nonvolatile memory device can be improved.

Figure 3:
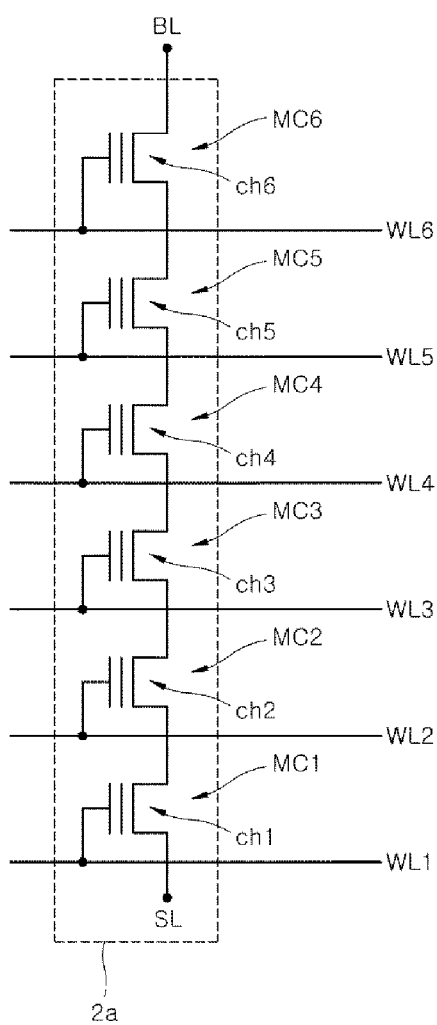
FIG. 3 is a circuit diagram schematically illustrating a nonvolatile memory device according to an embodiment of the present disclosure.

FIG. 3 is a circuit diagram schematically illustrating a nonvolatile memory device according to another embodiment of the present disclosure. Referring to FIG. 3, the nonvolatile memory device 2 may include a cell array having a string 2a. One end of the string 2a may be connected to a source line SL and the other end of the string 2a may be connected to a bit line BL. The string 2a may have first to sixth memory cell transistors MC1, MC2, MC3, MC4, MC5 and MC6 that are connected to each other in series. Although FIG. 3 illustrates that the string 2a has six memory cell transistors for the convenience of explanation, it is not necessarily limited thereto. The number of the memory cell transistors constituting the string 2a is not limited. The nonvolatile memory device 2 may, for example, be a NAND type flash memory device.

The first to sixth memory cell transistors MC1, MC2, MC3, MC4, MC5 and MC6 may have corresponding first to sixth channel layers ch1, ch2, ch3, ch4, ch5 and ch6 between the source line SL and the bit line BL. The first to sixth memory cell transistors MC1, MC2, MC3, MC4, MC5 and MC6 may each have a charge trap layer adjacent to the first to sixth channel layers ch1, ch2, ch3, ch4, ch5 and ch6, respectively. Each gate electrode layer of the first to sixth memory cell transistors MC1, MC2, MC3, MC4, MC5 and MC6 may be connected to different first to sixth word lines WL1, WL2, WL3, WL4, WL5 and WL6.

In a state in which a predetermined operation voltage is applied between the source line SL and the bit line BL, a predetermined gate voltage may be applied to a corresponding memory cell transistor through the first to sixth word lines WL1, WL2, WL3, WL4, WL5 and WL6. In the memory cell transistor to which the gate voltage is applied, a program operation or an erase operation may occur between the charge trap layer and the channel layer. Electrons or holes in the channel layer may tunnel into the charge trap layer so that the electrons can be introduced into the charge trap layer or the electrons stored in the charge trap layer can be erased, thereby performing the program operation or the erase operation. Change of the electrons according to the program operation or the erase operation may be stored non-volatilely in the charge trap layer as an electrical signal. Accordingly, the first to sixth memory cell transistors MC1, MC2, MC3, MC4, MC5 and MC6 can perform the nonvolatile memory operation.

Figure 4:
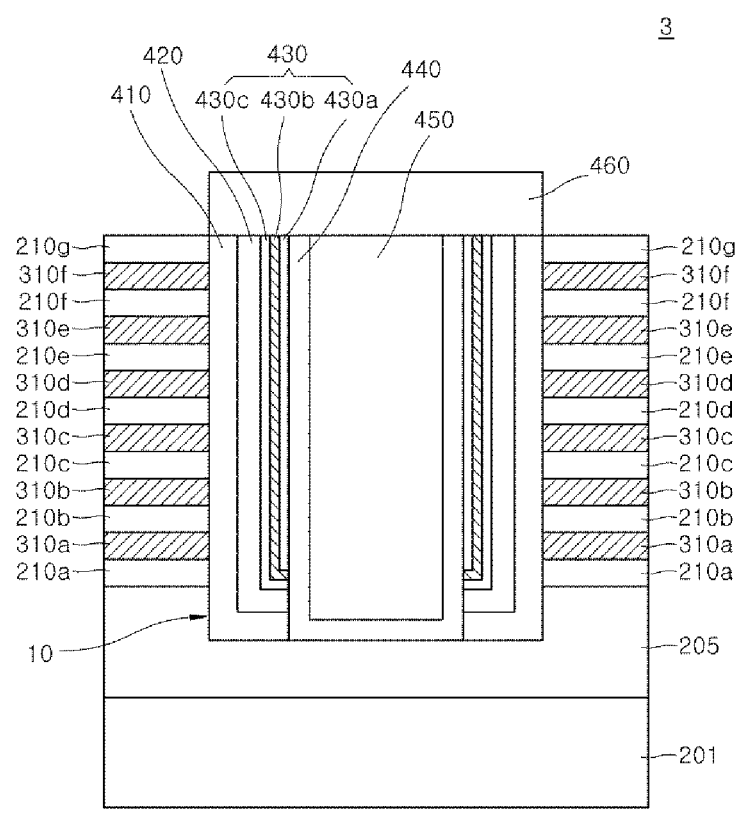
FIG. 4 is a cross-sectional view of a nonvolatile memory device according to an embodiment of the present disclosure.

FIG. 4 is a cross-sectional view of a nonvolatile memory device according to an embodiment of the present disclosure. The nonvolatile memory device 3 may be an embodiment of the nonvolatile memory device 2 having a configuration of the circuit diagram of FIG. 3.

Referring to FIG. 4, the nonvolatile memory device 3 may include a substrate 201, a base conduction layer 205 disposed on the substrate 201, first to seventh interlayer insulating layers 210a, 210b, 210c, 210d, 210e, 210f and 210g and first to sixth gate electrode layers 310a, 310b, 310c, 310d, 310e and 310f, which are alternately stacked on the base conduction layer 205. In addition, the nonvolatile memory device 3 may include a trench 10 penetrating the first to seventh interlayer insulating layers 210a, 210b, 210c, 210d, 210e, 210f and 210g and the first to sixth gate electrode layers 310a, 310b, 310c, 310d, 310e and 310f on the base conduction layer 205. The nonvolatile memory device 3 may include a charge barrier layer 410, a charge trap layer 420 and a tunneling structure 430 that are sequentially disposed on the side wall of the trench 10. The tunneling structure 430 may include first to third tunneling layers 430a, 430b and 430c.

In addition, the nonvolatile memory device 3 may have a channel layer 440 extending in a direction perpendicular to the substrate 201, for example, z-direction on the tunneling structure 430. Meanwhile, the trench 10 in which the charge barrier layer 410, the charge trap layer 420, the tunneling structure 430 and the channel layer 440 are formed may be filled with a filling insulating layer 450.

Referring to FIG. 4, portions of the charge barrier layer 410, the charge trap layer 420, the tunneling structure 430 and the channel layer 440 covered by the first to sixth gate electrode layers 310a, 310b, 310c, 310d, 310e and 310f in the lateral direction, for example, in the x-direction as shown in FIG. 4, may constitute the first to sixth memory cell transistors MC1, MC2, MC3, MC4, MC5 and MC6 disclosed in FIG. 3, respectively.

A bit line 460 may be disposed over the trench 10. The bit line 460 may be conductively coupled to the channel layer 440. In addition, the channel layer 440 may be connected to the base conduction layer 205 and the base conduction layer 205 may be connected to a source line (not illustrate).

In an embodiment, the substrate 201 may be a semiconductor substrate such as, for example, a silicon (Si) substrate, a gallium arsenic (GaAs) substrate, an indium phosphide (InP) substrate, a germanium (Ge) substrate, or a silicon germanium (SiGe) substrate. The semiconductor substrate 201 may be a doped n-type or p-type semiconductor substrate (e.g., a semiconductor substrate that was doped to form an n-type or p-type semiconductor substrate) having conductive properties. In another embodiment, the substrate 201 may be an insulative substrate like a silicon-on-insulator (SOI) substrate.

The base conduction layer 205 may be disposed on the substrate 201. The base conduction layer 205 may, for example, include doped semiconductor, metal, conductive metal nitride or conductive metal silicide. In an example, the base conduction layer 205 may include n-type doped silicon. In some embodiments, the base conduction layer 205 may include tungsten (W), titanium (Ti), copper (Cu), aluminum (Al), tungsten nitride, titanium nitride, tantalum nitride, tungsten silicide, titanium silicide, tantalum silicide or a combination of two or more thereof. In an embodiment, the base conduction layer 205 may be electrically connected to the source line (not illustrated).

In some embodiments, although not illustrated, the substrate 201 may include a well doped with an n-type dopant or a p-type dopant. Various types of semiconductor integrated circuits may be disposed between the substrate 201 and the base conduction layer 205. As an example, one or more conductive circuit pattern layer and one or more insulating pattern layer for insulating the conductive circuit pattern layer may be disposed between the substrate 201 and the base conduction layer 205.

The first to seventh interlayer insulating layers 210a, 210b, 210c, 210d, 210e, 210f and 210g and the first to sixth gate electrode layers 310a, 310b, 310c, 310d, 310e and 310f may be disposed on the base conduction layer 205. As illustrated, the lowermost first interlayer insulating layer 210a may contact the base conduction layer 205. In some embodiments, the first to seventh interlayer insulating layers 210a, 210b, 210c, 210d, 210e, 210f and 210g may each, for example, include insulative oxide, insulative nitride, insulative oxynitride or the like. In some embodiments, the first to seventh interlayer insulating layers 210a, 210b, 210c, 210d, 210e, 210f and 210g may each, for example, include silicon oxide, silicon nitride, or silicon oxynitride.

The first to sixth gate electrode layers 310a, 310b, 310c, 310d, 310e and 310f may be electrically connected to word lines (not illustrated) of the nonvolatile memory device 3. In some embodiments, the first to sixth gate electrode layers 310a, 310b, 310c, 310d, 310e and 310f may each, for example, include metal, conductive metal nitride, conductive metal silicide, conductive metal oxide, conductive metal carbide or the like. In some embodiments, the first to sixth gate electrode layers 310a, 310b, 310c, 310d, 310e and 310f may each, for example, include tungsten (W), titanium (Ti), copper (Cu), ruthenium (Ru), tungsten nitride, titanium nitride, tantalum nitride, ruthenium oxide, tungsten carbide, titanium carbide, tungsten silicide, titanium silicide, tantalum silicide or a combination of two or more thereof.

The charge barrier layer 410 can function as a barrier layer for suppressing the movement of electrons or holes introduced into the charge trap layer 420 from the channel layer 440 to the gate electrode layers 310a, 310b, 310c, 310d, 310e and 310f. In various embodiments, the configuration of the charge barrier 410 may be substantially the same as the configuration of the charge barrier layer 130 described above with reference to FIG. 1.

The charge trap layer 420 can trap electrons introduced from the channel layer 440 in the trap sites of the charge trap layer 420 and store the electrons in a nonvolatile manner during a program operation. In addition, the charge trap layer 420 may recombine holes introduced from the channel layer 440 with the electrons stored in the charge trap layer 420 to erase the stored electrons during an erase operation. In various embodiments, the configuration of the charge trap 420 may be substantially the same as the configuration of the charge trap layer 120 described above with reference to FIG. 1.

The tunneling structure 430 may include first to third tunneling layers 430a, 430b and 430c. The first tunneling layer 430a may be disposed to contact the channel layer 440, and the third tunneling layer 430c may be disposed to contact the charge trap layer 420. The second tunneling layer 430b may be disposed between the first tunneling layer 430a and the third tunneling layer 430c. In various embodiments, the configurations and functions of the first to third tunneling layers 430a, 430b and 430c may be substantially the same as the configurations and functions of the first to third tunneling layers 112, 114 and 116 described above with reference to FIGS. 1, 2A, and 2B.

The channel layer 440 may be disposed to extend in a direction perpendicular to the substrate 201 and to cover the tunneling structure 430. The channel layer 440 may, for example, include a semiconductor material. The semiconductor material may, for example, include silicon (Si), germanium (Ge), silicon germanium (SiGe), gallium arsenic (GaAs), indium gallium arsenic (In GaAs) or a combination of two or more thereof. In an embodiment, the semiconductor material may be doped n-type or p-type semiconductor material. In some embodiments, the channel layer 440 may, for example, include conductive metal oxide such as indium-gallium-zinc (In—Ga—Zn) oxide, indium-tin (In—Sn) oxide or the like.

The filling insulating layer 450 may include an insulative material such as, for example, an oxide material, a nitride material or an oxynitride material.

As described above, according to the embodiment of the present disclosure, the tunneling structure 430 includes the first to third tunneling layers 430a, 430b and 430c. By arranging the first to third tunneling layers 430a, 430b and 430c such that band gap energy of the second tunneling layer 430b is smaller than band gap energies of the first and third tunneling layers 430a and 430c, a leakage current can be reduced at a gate voltage less than a predetermined threshold voltage. In addition, program and erase efficiency of the nonvolatile memory device can be increased at a gate voltage equal to or higher than the predetermined threshold voltage. In this case, the second tunneling layer 430b may have a higher dielectric constant than the first and third tunneling layers 430a and 430c.

Figure 5:
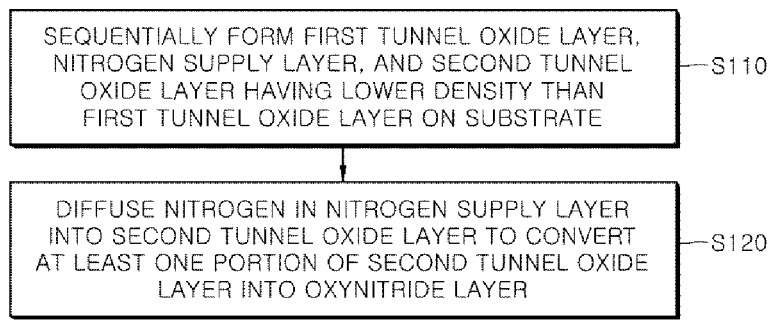
FIG. 5 is a flow chart illustrating a method of fabricating a nonvolatile memory device according to an embodiment of the present disclosure.

FIG. 5 is a flow chart illustrating a method of fabricating a nonvolatile memory device according to an embodiment of the present disclosure. Referring to FIG. 5, in operation S110, a first tunnel oxide layer, a nitride supply layer and a second tunnel oxide layer having a density lower than that of the first tunnel oxide layer are sequentially formed on a substrate. In operation S120, nitrogen in the nitrogen supply layer is diffused into the second tunnel oxide layer to convert at least a portion of the second tunnel oxide layer into an oxynitride layer. As a result, a first tunneling layer can be formed from the first tunnel oxide layer in which diffusion of the nitrogen is relatively suppressed. In addition, a second tunneling layer can be formed from nitrogen supply layer and a portion of the second tunneling oxide layer in which the nitrogen is diffused. A third tunneling layer can be formed from a portion of the second tunnel oxide layer in which the nitrogen has not introduced by diffusion.

The nonvolatile memory device having the first to third tunneling layers can be fabricated by performing a process that includes at least operations S110 and S120.

A specific example of a method of fabricating the non-volatile memory device will be described in more detail herein using the cross-sectional views of FIGS. 6 to 9. The method of fabricating the nonvolatile memory device described below with reference to FIGS. 6 to 9 may be used to fabricate the nonvolatile memory device 1 described above with reference to FIG. 1.

Figure 6:
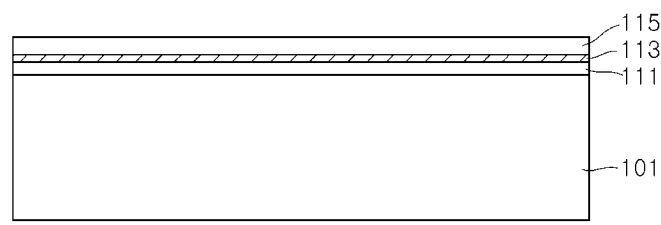
FIGS. 6 to 9 are cross-sectional views illustrating a method of fabricating a nonvolatile memory device according to an embodiment of the present disclosure.

Referring to FIG. 6, a first tunnel oxide layer 111, a nitrogen supply layer 113 and a second tunnel oxide layer 115 having a density lower than that of the first tunnel oxide layer 111 are formed on a substrate 101. The substrate 101 may, for example, be a silicon (Si) substrate, a gallium arsenic (GaAs) substrate, an indium phosphide (InP) substrate, a germanium (Ge) substrate, or a silicon germanium (SiGe) substrate. In an embodiment, the substrate 101 may be doped to have conductivity. As an example, the substrate 101 may be doped with an n-type dopant or a p-type dopant. In some embodiments, the substrate 101 may include a well region doped with an n-type dopant or a p-type dopant in the substrate 101.

The first tunnel oxide layer 111 may include a first oxide material. The nitrogen supply layer 113 may include an oxynitride material. The second tunnel oxide layer 115 may include a second oxide material. At this time, a density of the first oxide material may be higher than that of the second oxide material. That is, the second oxide material may have a relatively lower bonding frequency between silicon and oxygen than the first oxide material.

Accordingly, after the first tunnel oxide layer 111, the nitrogen supply layer 113 and the second tunnel oxide layer 115 are formed, a concentration of defects present in the first oxide material may be lower than a concentration of defects present in the second oxide material. The first tunnel oxide layer 111, the nitrogen supply layer 113 and the second tunnel oxide layer 115 may be formed by chemical vapor deposition or atomic layer deposition, as an example.

In an embodiment, the nitrogen supply layer 113 may be formed by forming a thin silicon oxynitride layer having higher nitrogen concentration than oxygen. In an embodiment, the first tunnel oxide layer 111 and the second tunnel oxide layer 115 may each be a silicon oxide layer. Here, the first tunnel oxide layer 111 may be formed at a high temperature of 750° C. or higher. In some embodiments, the first tunnel oxide layer 111 may be formed at a process pressure of 0.4 to 0.6 Torr. On the other hand, the second tunnel oxide layer 115 may be formed at a relatively low temperature of less than 750° C. In some embodiments, the second tunnel oxide layer 115 may be formed at a relatively low pressure of less than 0.4 Torr. In various embodiments, a constant temperature may be employed during deposition of the first tunnel oxide layer 111 using a range of pressures. In other embodiments, however, a constant pressure may be employed during deposition of the first tunnel oxide layer 111 using a range of temperatures. Similarly, a constant temperature may be employed in some embodiments during deposition of the second tunnel oxide layer 115 using a range of pressures. While in other embodiments, however, a content pressure may be employed during deposition of the second tunnel oxide layer 115 using a range of temperatures. In an embodiment, the nitrogen supply layer 113 may be a silicon oxynitride layer. Here, a nitrogen concentration in the silicon oxynitride layer may be equal to or greater than 40 atomic percent.

Figure 7:
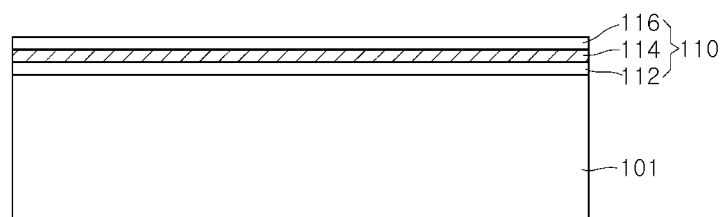
Figure 7:
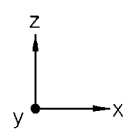

Referring to FIG. 7, heat treatment is performed to the structure of FIG. 6. In the heat treatment, nitrogen may be more strongly or effectively diffused from the nitrogen supply layer 113 to the second tunnel oxide layer 115 rather than to the first tunnel oxide layer 111 by taking advantage of the difference between nitrogen diffusion rates of the first tunnel oxide layer 111 and the second tunnel oxide layer 115.

Specifically, the heat treatment may be selectively or carefully performed to promote nitrogen diffusion into the second tunnel oxide layer 115 while suppressing nitrogen diffusion to the first tunnel oxide layer 111. The first and second tunnel oxide layers 111 and 115 may have first and second nitrogen diffusion rates, respectively. Since the density of the first tunnel oxide layer 111 is higher than the density of the second tunnel oxide layer 115, the first nitrogen diffusion rate of the first tunnel oxide layer 111 may be lower than the second nitrogen diffusion rate of the second tunnel oxide layer 115. In addition, the nitrogen diffusion rate in the first and second tunnel oxide layers 111 and 115 may be influenced by the heat treatment temperature condition. Accordingly, the heat treatment temperature condition (e.g., the temperature at which the first tunnel oxide layer 111, the nitrogen supply layer 113, and the second tunnel oxide layer 115 may be exposed for nitrogen diffusion) may be selected that promotes the nitrogen diffusion into the second tunnel oxide layer 115 while suppressing nitrogen diffusion in the first tunnel oxide layer 111. In some embodiments, the treatment temperature condition can be determined based, at least in part, on the densities of the first and second tunnel oxide layers 111 and 115. Then, the heat treatment for the first tunnel oxide layer 111, the nitrogen supply layer 113 and the second tunnel oxide layer 115 on the substrate 101 can be performed at a predetermined temperature condition. For example, in some embodiments, the heat treatment may be performed at a temperature less than 750° C.

As a result, as illustrated in FIG. 7, a charge tunneling structure 110 including the first to third tunneling layers 112, 114 and 116 can be formed on the substrate 101. The first tunneling layer 112 may be formed from the first tunnel oxide layer 111 in which the diffusion of nitrogen is relatively suppressed. The second tunneling layer 114 may be formed from the nitrogen supply layer 113 and a portion of the second tunnel oxide layer 115 in which nitrogen of the nitrogen supply layer 113 has been diffused. Accordingly, the second tunneling layer 114 may be an oxynitride layer. The third tunneling layer 116 may be formed from a region of the second tunnel oxide layer 115 in which the nitrogen of the nitrogen supply layer 113 has not been diffused.

Figure 8:
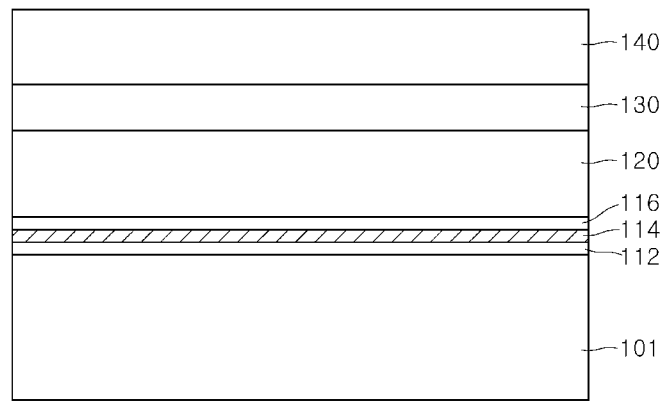
Figure 8:
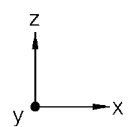

Referring to FIG. 8, a charge trap layer 120, a charge barrier layer 130 and a gate electrode layer 140 are sequentially formed on the third tunneling layer 116. In various embodiments, the charge trap layer 120 may include a nitride material or an oxynitride material. In an embodiment, the charge trap layer 120 may be a silicon nitride layer or a silicon oxynitride layer. The charge trap layer 120 may be formed, for example, by chemical vapor deposition, atomic layer deposition or the like. The charge barrier layer 130 may include an oxide material. In an embodiment, the charge barrier layer 130 may be a silicon oxide layer. The charge barrier layer 130 may be formed, for example, by chemical vapor deposition, atomic layer deposition or the like.

The gate electrode layer 140 may include a conductive material. The conductive material may, for example, include tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide or a combination of two or more thereof. The gate electrode layer 140 may be formed, for example, by chemical vapor deposition, atomic layer deposition, or the like.

Figure 9:
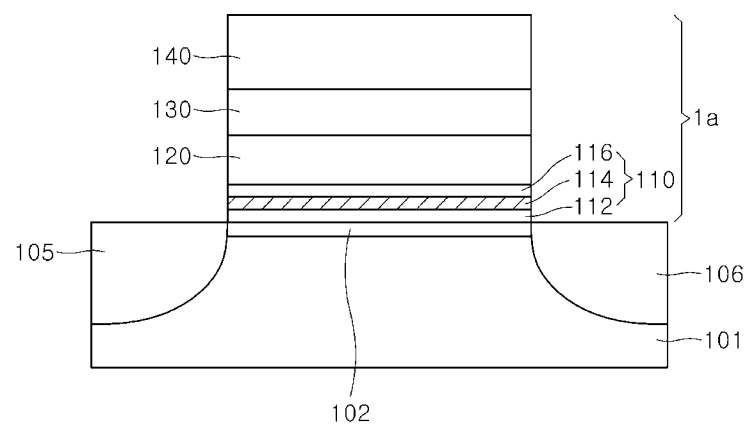

Referring to FIG. 9, the first to third tunneling layers 112, 114 and 116, the charge trap layer 120, the charge barrier layer 130 and the gate electrode layer 140 are patterned to form a gate pattern structure 1a and exposing the substrate 101. Then, source and drain regions 105 and 106 are formed by doping regions of the substrate 101 located adjacent to or at both ends/sides of the gate pattern structure 1a.

By performing the above-described process, the nonvolatile memory device according to the embodiment of the present disclosure can be fabricated. According to the embodiment of the present disclosure, a first tunnel oxide layer having a first density, a second tunnel oxide layer having a second density lower than the first density, and a nitrogen supply layer are formed on a substrate, and then nitrogen in the nitrogen supply layer is diffused into the second tunnel oxide layer to convert at least a portion of the second tunnel oxide layer into an oxynitride layer. As a result, the first tunneling layer can be formed from the first tunnel oxide layer in which the diffusion of nitrogen has been relatively suppressed. Further, the second tunneling layer can be formed from the nitrogen supply layer and a portion of the second tunnel oxide layer in which nitrogen has been diffused. The third tunneling layer can be formed from a portion of the second tunnel oxide layer in which nitrogen has not been diffused.

In other words, the diffusion of nitrogen is suppressed in the first tunnel oxide layer containing a relatively high density oxide, so that formation of trap sites by the nitrogen is suppressed in the inside, and as a result, leakage current can be decreased between the first tunnel oxide layer and the channel layer. In the second tunnel oxide layer containing a relatively low-density oxide material, the nitrogen is diffused to form an oxynitride layer, so that a second tunneling layer that functions to improve the tunneling efficiency of the charge tunneling structure can be reliably formed.

Figure 10:
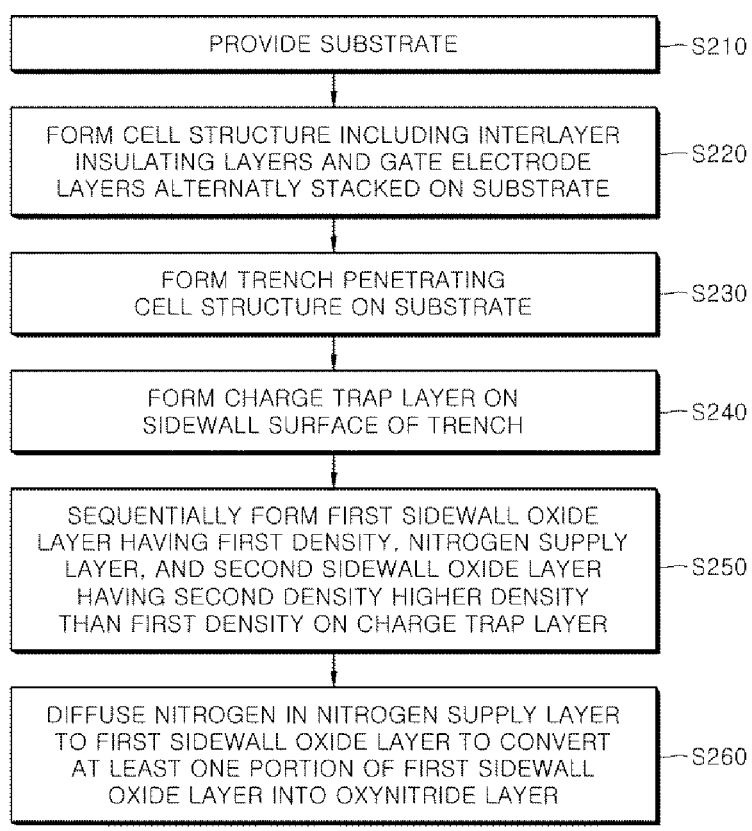
FIG. 10 is a flow chart illustrating a method of fabricating a nonvolatile memory device according to another embodiment of the present disclosure.

FIG. 10 is a flow chart illustrating a method of fabricating a nonvolatile memory device according to another embodiment of the present disclosure. Referring to FIG. 10, in operation S210, a substrate is provided. In operation S220, a cell electrode structure including interlayer insulating layers and gate electrode layers that are alternately stacked is formed on the substrate. In operation S230, a trench penetrating the cell electrode structure on the substrate is formed. In operation S240, a charge trap layer is formed on a sidewall surface of the trench. In operation S250, a first sidewall oxide layer having a first density, a nitrogen supply layer, and a second sidewall oxide layer having a second density greater than the first density are sequentially formed on the charge trap layer. In operation S260, nitrogen in the nitrogen supply layer is diffused into the first sidewall oxide layer to convert at least a portion of the first sidewall oxide layer into an oxynitride layer. By performing a process including the above-described operations S210 to S260, the nonvolatile memory device including a first to third tunneling layers can be fabricated on the substrate.

A specific example of a method of fabricating a nonvolatile memory device will now be provided in reference to the cross-sectional views of FIGS. 11 to 16. The method of fabricating the nonvolatile memory device described below with reference to FIGS. 11 to 16 may be employed to fabricate, for example, the nonvolatile memory devices 2 and 3 described above with reference to FIGS. 3 and 4.

Figure 11:
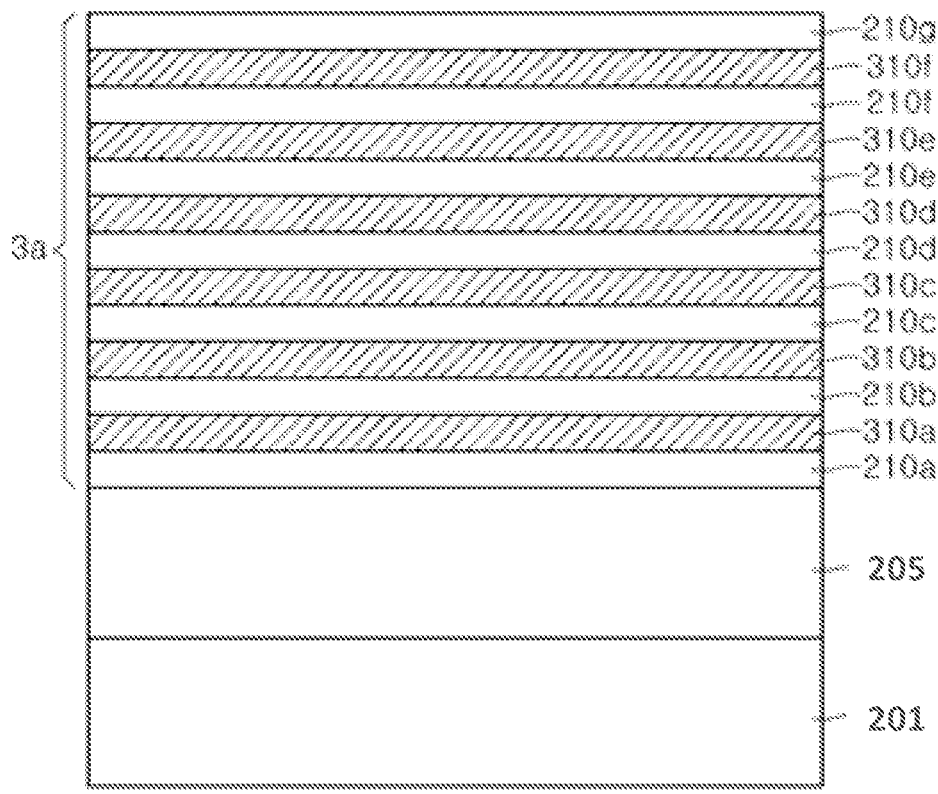
FIGS. 11 to 16 are cross-sectional views illustrating a method of fabricating a nonvolatile memory device according to another embodiment of the present disclosure.

Referring to FIG. 11, a substrate 201 is provided. The substrate 201 may be a semiconductor substrate. The semiconductor substrate may, for example, be a silicon (Si) substrate, a gallium arsenic (GaAs) substrate, an indium phosphide (InP) substrate, a germanium (Ge) substrate, or a silicon germanium (SiGe) substrate. In some embodiments, the semiconductor substrate may be doped to form an n-type or a p-type semiconductor substrate having conductivity. As another example, the substrate 201 may be an insulative substrate like a silicon-on-insulator (SOI) substrate.

Then, a base conduction layer 205 is formed on the substrate 201. The base conduction layer 205 may, for example, include doped semiconductor, metal, conductive metal nitride or conductive metal silicide. In an example, the base conduction layer 205 may include n-type doped silicon. In another example, the base conduction layer 205 may include tungsten (W), titanium (Ti), copper (Cu), aluminum (Al), tungsten nitride, titanium nitride, tantalum nitride, tungsten silicide, titanium silicide, tantalum silicide or a combination of two or more thereof. The base conduction layer 205 may be formed, for example, by chemical vapor deposition or atomic layer deposition.

Then, a cell structure 3a including interlayer insulating layers 210a, 210b, 210c, 210d, 210e, 210f and 210g and gate electrode layers 310a, 310b, 310c, 310d, 310e and 310f that are alternately stacked is formed on the base conduction layer 205. In some embodiments, the interlayer insulating layers 210a, 210b, 210c, 210d, 210e, 210f and 210g may each, for example, include an insulative oxide material, an insulative nitride material, an insulative oxynitride material or the like. In some embodiments, the interlayer insulating layers 210a, 210b, 210c, 210d, 210e, 210f and 210g may each, for example, include silicon oxide, silicon nitride, or silicon oxynitride. In various embodiments, the interlayer insulating layers 210a, 210b, 210c, 210d, 210e, 210f and 210g may each be formed, for example, by chemical vapor deposition or atomic layer deposition.

In some embodiments, the gate electrode layers 310a, 310b, 310c, 310d, 310e and 310f may each, for example, include metal, conductive metal nitride, conductive metal silicide, conductive metal oxide, conductive metal carbide or the like. In some embodiments, the gate electrode layers 310a, 310b, 310c, 310d, 310e and 310f may each, for example, include tungsten (W), titanium (Ti), copper (Cu), ruthenium (Ru), tungsten nitride, titanium nitride, tantalum nitride, ruthenium oxide, tungsten carbide, titanium carbide, tungsten silicide, titanium silicide, tantalum silicide or a combination of two or more thereof. In various embodiments, the gate electrode layers 310a, 310b, 310c, 310d, 310e and 310f may each be formed, for example, by chemical vapor deposition or atomic layer deposition.

Figure 12:
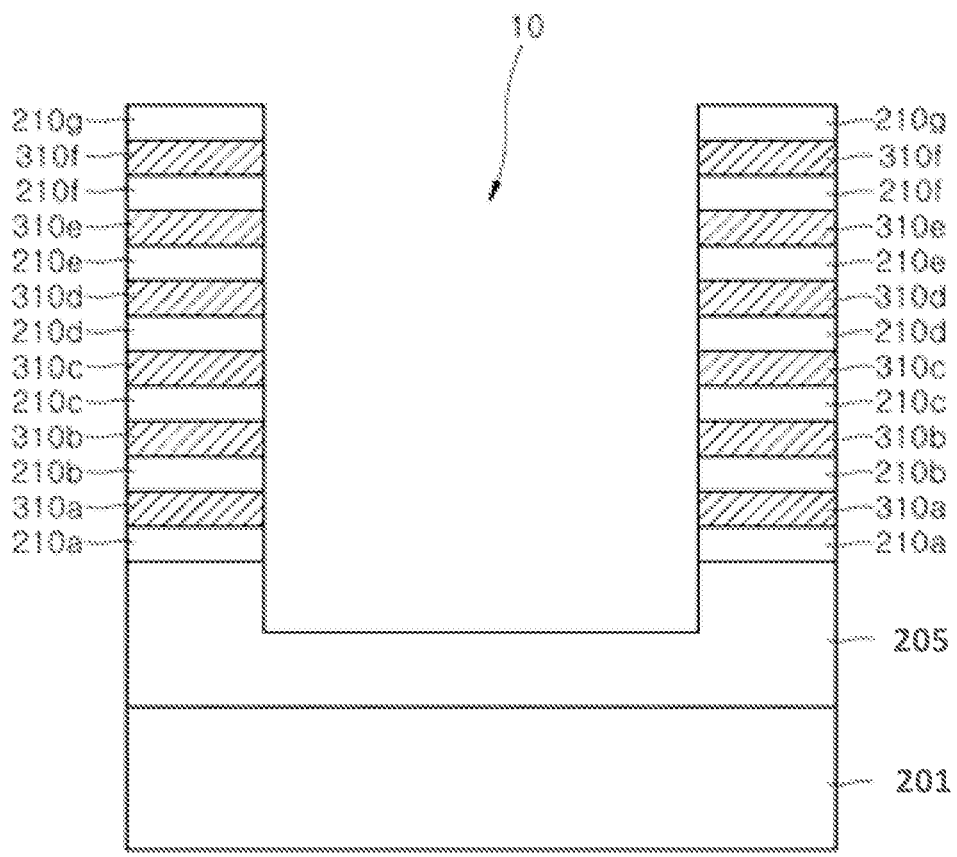

Referring to FIG. 12, a trench 10 penetrating the cell structure 3a and partly into the base conduction layer 205 is formed. Specifically, the cell structure 3a stacked on the base conduction layer 205 is selectively etched to form the trench 10 exposing the base conduction layer 205. As a result of etching, side surfaces of the interlayer insulating layers 210a, 210b, 210c, 210d, 210e, 210f and 210g and the gate electrode layers 310a, 310b, 310c, 310d, 310e and 310f may be exposed on the sidewall surface of the trench 10. The trench 10 may be formed by applying, for example, an anisotropic etching method.

Figure 13:
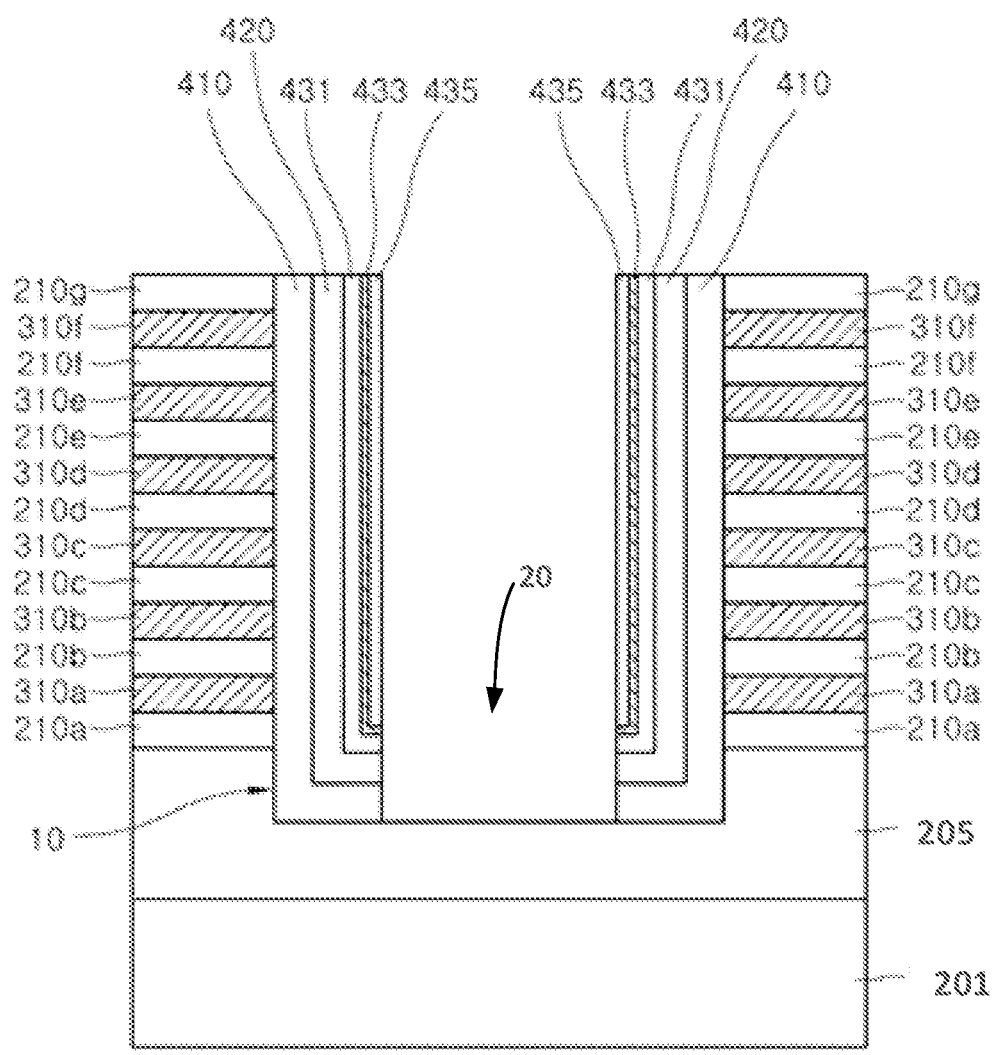

Referring to FIG. 13, a charge barrier layer 410, a charge trap layer 420, a first sidewall oxide layer 431, a nitrogen supply layer 433, and a second sidewall oxide layer 435 are sequentially formed on the sidewall surface of the trench 10.

In a specific embodiment, a barrier material layer corresponding to the charge barrier layer 410, a trap material layer corresponding to the charge trap layer 420, a first oxide material layer corresponding to the first sidewall oxide layer 431, a nitride material layer corresponding to the nitrogen supply layer 433, and a second oxide material layer corresponding to the second sidewall oxide layer 435 are sequentially formed along an inner wall surface of the trench 10. The barrier material layer, the trap material layer, the first oxide material layer, the nitride material layer and the second oxide material layer may be formed by chemical vapor deposition or atomic layer deposition, respectively.

Then, the barrier material layer, the trap material layer, the first oxide material layer, the nitride material layer and the second oxide material layer are selectively etched to form a contact hole 20 selectively exposing the base conduction layer 205. In the etching process to form the contact hole 20, at least portions of the barrier material layer, the trap material layer, the first oxide material layer, the nitride material layer and the second oxide material layer formed at the bottom of the trench 10 may be removed. As a result, the charge barrier layer 410, the charge trap layer 420, the first sidewall oxide layer 431, the nitrogen supply layer 433, and the second sidewall oxide layer 435 can be formed.

Referring yet to FIG. 13, the charge barrier layer 410 may include oxide. In an embodiment, the charge barrier layer 410 may be a silicon oxide layer. The charge trap layer 420 may include a nitride material or an oxynitride material. In an embodiment, the charge trap layer 420 may be a silicon nitride layer or a silicon oxynitride layer.

The first sidewall oxide layer 431 may include a first oxide material. The nitrogen supply layer 433 may include an oxynitride material. The second sidewall oxide layer 435 may include a second oxide material. Here, a concentration of the first oxide material may be lower than that of the second oxide material. Accordingly, after the first sidewall oxide layer 431, the nitrogen supply layer 433 and the second sidewall oxide layer 435 are formed, a concentration of defects present in the first sidewall oxide layer 431 may be greater than a concentration of defects present in the second sidewall oxide layer 435.

In an embodiment, the first sidewall oxide layer 431 and the second sidewall oxide layer 435 may each be a silicon oxide layer. Here, the first sidewall oxide layer 431 may be formed at a relatively low temperature of less than 750° C. In some embodiments the first sidewall oxide layer 431 may be formed at a relatively low pressure of less than 0.4 Torr. On the other hand, the second sidewall oxide layer 435 may be formed at a relatively high temperature of 750° C. or higher. In some embodiments, the second sidewall oxide layer 435 may be formed at a process pressure of 0.4 to 0.6 Torr. In an embodiment, the nitrogen supply layer 433 may be a silicon oxynitride layer. Here, nitrogen concentration in the silicon oxynitride layer may be equal to or greater than 40 atomic percent.

Figure 14:
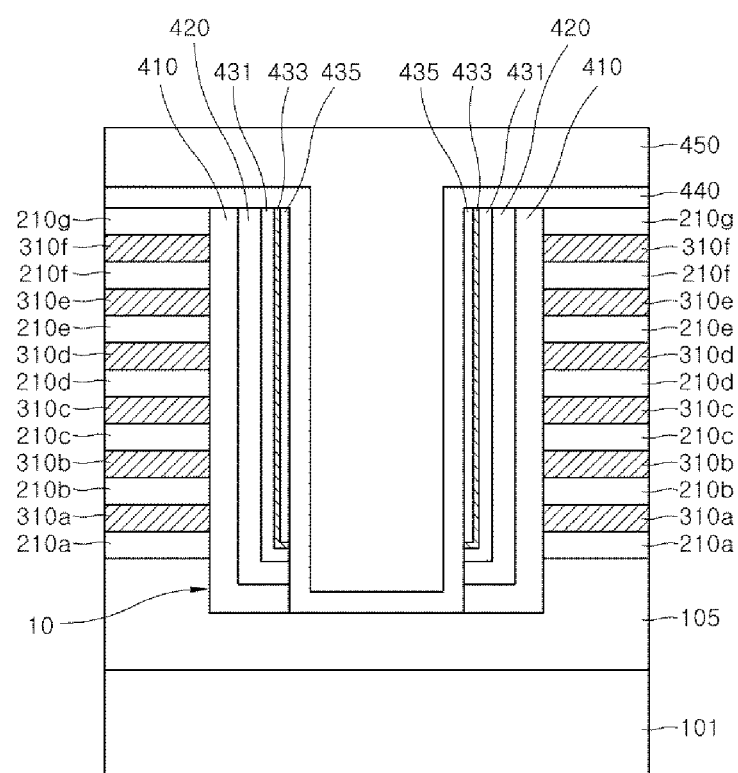

Referring to FIG. 14, a channel layer 440 is formed on the structure of FIG. 13. Specifically, the channel layer 440 may be formed to contact the base conduction layer 205 exposed through the contact hole 20 and to cover the second sidewall oxide layer 435 on the sidewall surface of the trench 10. In addition, the channel layer 440 may be formed to cover the outside of the trench 10.

The channel layer 440 may, for example, include a semiconductor material. The semiconductor material may, for example, include silicon (Si), germanium (Ge), silicon germanium (SiGe), gallium arsenic (GaAs), indium gallium arsenic (InGaAs) or a combination of two or more thereof. In an embodiment, the semiconductor material may be doped into n-type or p-type. As another example, the channel layer 440 may include conductive metal oxide. The conductive metal oxide may include indium-gallium-zinc (In—Ga—Zn) oxide, indium-tin (InSn) oxide or the like. The channel layer may be formed, for example, by chemical vapor deposition or atomic layer deposition.

Then, a filling oxide layer 450 is formed on the channel layer 440. The filling oxide layer 450 may be formed to fill the trench 10 and be formed on the channel layer 440 outside the trench 10. The filling oxide layer 450 may, for example, include an insulative material. The insulative material may, for example, include an oxide material, a nitride material, or an oxynitride material.

Figure 15:
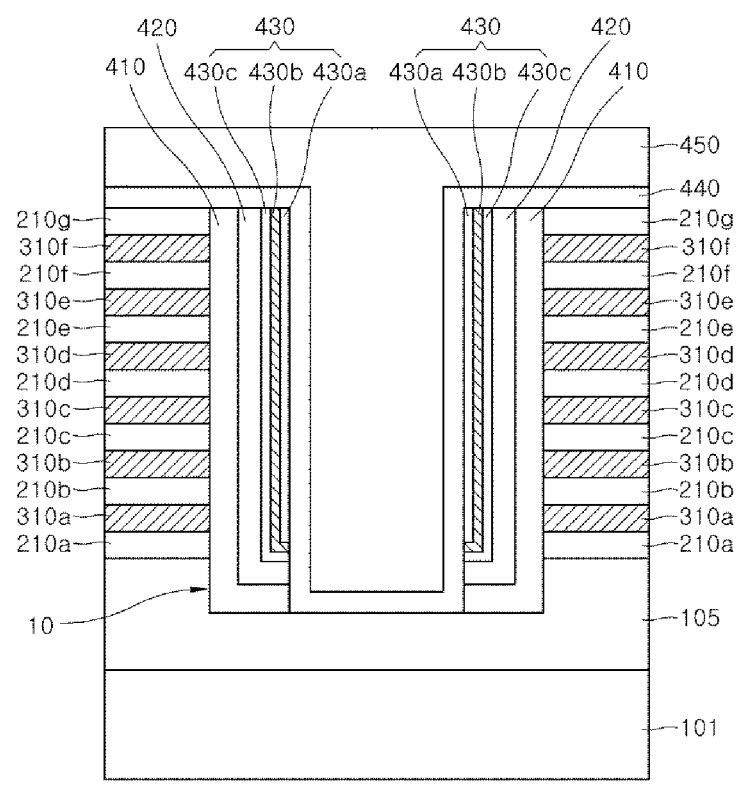
Figure 16:
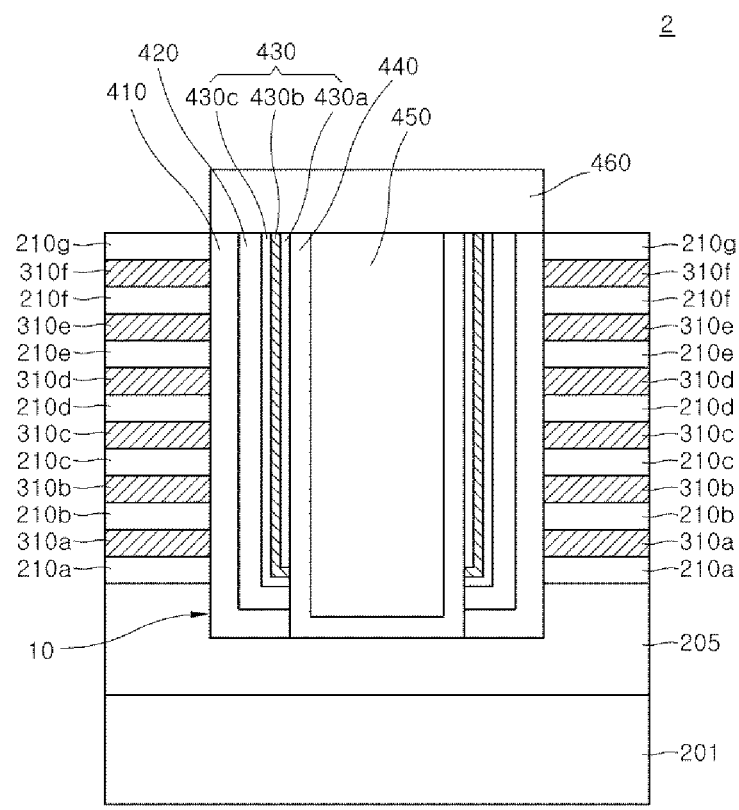

Referring to FIG. 15, heat treatment is performed to the structure of FIG. 14. In the heat treatment, nitrogen may be thermally diffused from the nitrogen supply layer 433 to the first sidewall oxide layer 431 using difference between nitrogen diffusion rates of the first sidewall oxide layer 431 and the second sidewall oxide layer 435.

Specifically, the heat treatment may be performed by promoting nitrogen diffusion into the first sidewall oxide layer 431 while suppressing nitrogen diffusion into the second sidewall oxide layer 435. The first and second sidewall oxide layers 431 and 435 may have first and second nitrogen diffusion rates, respectively. Since the density of the second sidewall oxide layer 435 is higher than the density of the first sidewall oxide layer 431, the second nitrogen diffusion rate of the second sidewall oxide layer 435 may be lower than the first nitrogen diffusion rate of the first sidewall oxide layer 431. In addition, the nitrogen diffusion rate in the oxide layer is influenced by the heat treatment temperature condition. Accordingly, the heat treatment temperature condition for promoting the nitrogen diffusion into the first sidewall oxide layer 431 while suppressing the nitrogen diffusion into the second sidewall oxide layer 435 can be determined based on the densities of the first and second sidewall oxide layers 431 and 435. Then the heat treatment for the first sidewall oxide layer 431, the nitrogen supply layer 433 and the second sidewall oxide layer 435 on the sidewall surface of the trench 10 can be performed at the determined temperature condition. As an example, the heat treatment may be performed at a temperature less than 750° C.

As a result, as illustrated in FIG. 15, a tunneling structure 430 including first to third tunneling layers 430a, 430b and 430c can be formed on the channel layer 440 along the sidewall surface of the trench 10. The first tunneling layer 430a can be formed from the second sidewall oxide layer 435 in which the diffusion of nitrogen has been relatively suppressed. The second tunneling layer 430b can be formed from the nitrogen supply layer 433 and a portion of the first sidewall oxide layer 431 in which nitrogen of the nitrogen supply layer 433 has been diffused. Accordingly, the second tunneling layer 430b may be an oxynitride layer. The third tunneling layer 430c can be formed from the remaining region of the first sidewall oxide layer 431 in which the nitrogen of the nitrogen supply layer 433 has not been diffused.

Although not illustrated, the channel layer 440 and the filling oxide layer 450 formed outside the trench layer 10 may be additionally removed. The channel layer 440 and the filling oxide layer 450 can be removed, for example, by a planarization process like a chemical mechanical polishing method or an etching process like etch-back. As a result, as in FIG. 16, an upper surface of the uppermost interlayer insulating layer 210g and upper surfaces of the charge barrier layer 410, the charge trap layer 420 and the tunneling structure 430 that extend in the z-direction may be located on the same plane.

Then, a bit line 460 is formed to cover the upper surfaces of the charge barrier layer 410, the charge trap layer 420, the tunneling structure 430 that extend in the z-direction, the channel layer 440 and the filing oxide layer 450. The bit line 460 may include a conductive material. The bit line 460 may be formed, for example, by chemical vapor deposition or atomic layer deposition.

By proceeding with the above described process, the nonvolatile memory device according to an embodiment of the present disclosure can be fabricated. According to the embodiment of the present disclosure, a first sidewall oxide having a first density, a second sidewall oxide layer having a second density higher than the first density, and a nitrogen supply layer disposed between the first and second sidewall oxide layers are formed on a sidewall surface of a trench, and then nitrogen in the nitrogen supply layer is diffused into the first sidewall oxide layer to convert at least a portion of the first sidewall oxide layer into an oxynitride layer. As a result, a first tunneling layer can be formed from the second sidewall oxide layer in which the diffusion of nitrogen has been relatively suppressed. Further, a second tunneling layer can be formed from the nitrogen supply layer and a portion of the first sidewall oxide layer in which nitrogen has been diffused. The third tunneling layer can be formed from a portion of the first sidewall oxide layer in which nitrogen has not been diffused.

In other words, the diffusion of nitrogen is suppressed in the second sidewall oxide layer containing a relatively high density oxide material, so that the formation of trap sites by the nitrogen is suppressed in the inside, and as a result, the leakage current can be decreased with the channel layer. The first sidewall oxide layer containing a relatively low-density oxide material can reliably form the second tunneling layer that functions to improve the tunneling efficiency of the charge tunneling structure by diffusing nitrogen to form an oxynitride layer.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A method of fabricating a nonvolatile memory device, the method comprising:
   sequentially forming a first tunnel oxide layer, a nitrogen supply layer and a second tunnel oxide layer having a density lower than a density of the first tunnel oxide layer on a substrate; and
   diffusing nitrogen in the nitrogen supply layer into the second tunnel oxide layer to convert at least a portion of the second tunnel oxide layer into an oxynitride layer.

2. The method of claim 1, wherein forming the nitrogen supply layer comprises forming a silicon oxynitride layer having a higher concentration of nitrogen than oxygen in the silicon oxynitride layer.

3. The method of claim 1, wherein a nitrogen diffusion rate in the first tunnel oxide layer is lower than a nitrogen diffusion rate in the second tunnel oxide layer.

4. The method of claim 3, wherein diffusing the nitrogen in the nitrogen supply layer into the second tunnel oxide layer comprises:
   diffusing the nitrogen from the nitrogen supply layer into the second tunnel oxide layer through heat treatment using a temperature condition that is based, at least in part, on a difference in nitrogen diffusion rates between the first tunnel oxide layer and the second tunnel oxide layer.

5. The method of claim 4, wherein the heat treatment comprises using a selective temperature condition to promote nitrogen diffusion into the second tunnel oxide layer while suppressing nitrogen diffusion into the first tunnel oxide layer.

6. The method of claim 1,
   wherein the first tunnel oxide layer comprises silicon oxide, the nitrogen supply layer comprises silicon oxynitride, and the second tunnel oxide layer comprises silicon oxide, and wherein the silicon oxide of the first tunnel oxide layer has a density higher than a density of the silicon oxide of the second tunnel oxide layer.

7. The method of claim 1, wherein a temperature for forming the first tunnel oxide layer is higher than a temperature for forming the second tunnel oxide layer.

8. The method of claim 1, further comprising forming a charge trap layer in contact with the second tunnel oxide layer,
wherein the charge trap layer comprises nitride or oxynitride.

9. The method of claim 8, further comprising:
forming a charge barrier layer in contact with the charge trap layer; and
forming a gate electrode layer in contact with charge barrier layer.

10. The method of claim 1, wherein converting at least a portion of the second tunnel oxide layer into an oxynitride layer comprises:
converting at least a portion of the second tunnel oxide layer into a thin film having a dielectric constant that is higher than the dielectric constant value of a first tunneling layer formed from the first tunnel oxide layer as a result of diffusing the nitrogen and the dielectric constant value of a third tunneling layer formed from a portion of the second tunnel oxide layer that the nitrogen did not diffuse into, where the thin film is at least a portion of a second tunneling layer formed from diffusing the nitrogen.

* * * * *